United States Patent
Yaldo et al.

(10) Patent No.: US 10,967,751 B2
(45) Date of Patent: Apr. 6, 2021

(54) METHOD TO DETECT THE PROPER CONNECTION OF A VEHICLE CHARGING CABLE

(71) Applicant: GM GLOBAL TECHNOLOGY OPERATIONS LLC, Detroit, MI (US)

(72) Inventors: Valor Yaldo, West Bloomfield, MI (US); Sai Vishnu Aluru, Novi, MI (US); Xiaofeng F. Song, Novi, MI (US)

(73) Assignee: GM GLOBAL TECHNOLOGY OPERATIONS, LLC, Detroit, MI (US)

( * ) Notice: Subject to any disclaimer, the term of this patent is extended or adjusted under 35 U.S.C. 154(b) by 166 days.

(21) Appl. No.: 16/408,839

(22) Filed: May 10, 2019

(65) Prior Publication Data
US 2020/0353826 A1    Nov. 12, 2020

(51) Int. Cl.
| | | |
|---|---|---|
| *B60L 53/00* | (2019.01) | |
| *B60L 53/16* | (2019.01) | |
| *H02J 7/00* | (2006.01) | |
| *B60L 53/66* | (2019.01) | |
| *B60L 53/30* | (2019.01) | |
| *B60L 53/53* | (2019.01) | |
| *G01R 31/69* | (2020.01) | |

(52) U.S. Cl.
CPC ............. *B60L 53/16* (2019.02); *B60L 53/305* (2019.02); *B60L 53/53* (2019.02); *B60L 53/66* (2019.02); *G01R 31/69* (2020.01); *H02J 7/0042* (2013.01); *Y02T 90/14* (2013.01)

(58) Field of Classification Search
CPC ........ B60L 53/16; B60L 53/66; B60L 53/305; B60L 53/53; G01R 31/69; H02J 7/0042; Y02T 90/14
See application file for complete search history.

(56) References Cited

U.S. PATENT DOCUMENTS

| | | | | |
|---|---|---|---|---|
| 5,809,161 A | * | 9/1998 | Auty | G01P 3/38 340/937 |
| 7,733,370 B2 | | 6/2010 | Werth et al. | |
| 8,033,349 B2 | * | 10/2011 | Ortmann | B60L 53/16 180/65.1 |
| 8,725,330 B2 | * | 5/2014 | Failing | B60L 55/00 701/22 |

(Continued)

FOREIGN PATENT DOCUMENTS

| | | |
|---|---|---|
| WO | 2013013713 A1 | 1/2013 |
| WO | 2018155895 A1 | 8/2018 |

*Primary Examiner* — Naum Levin
(74) *Attorney, Agent, or Firm* — Lorenz & Kopf, LLP (57) ABSTRACT

One general aspect includes a system to detect a sufficient charging cable connection, the system including a memory configured to include one or more executable instructions and a processor configured to execute the executable instructions, where the executable instructions enable the processor to carry out the steps of: capturing an image of at least a portion of a vehicle body; determining whether the image includes a charging cable being sufficiently engaged with the portion of the vehicle body; and based on the determination of whether the image includes the charging cable being sufficiently connected to the portion of the vehicle body, producing a connection notification.

14 Claims, 5 Drawing Sheets

(56) References Cited

U.S. PATENT DOCUMENTS

| | | | |
|---|---|---|---|
| 9,300,883 B2* | 3/2016 | Nakamura | A61B 5/0059 |
| 9,302,609 B2 | 4/2016 | Farah et al. | |
| 9,659,350 B2* | 5/2017 | Kobayashi | G06T 5/50 |
| 9,738,125 B1* | 8/2017 | Brickley | B60D 1/26 |
| 10,061,975 B2* | 8/2018 | Ferrara | G06T 7/0002 |
| 10,093,189 B2* | 10/2018 | Sommarstrom | B63B 27/34 |
| 10,377,345 B1* | 8/2019 | Oesterling | B60R 25/241 |
| 10,387,734 B2* | 8/2019 | Yamamoto | G08G 1/167 |
| 10,744,882 B2* | 8/2020 | Hashimoto | B60L 53/12 |
| 10,798,542 B2* | 10/2020 | Mizutani | H04W 4/44 |
| 2010/0065344 A1* | 3/2010 | Collings, III | B60L 3/10 180/2.1 |
| 2014/0067660 A1* | 3/2014 | Cornish | G06Q 20/145 705/39 |
| 2014/0267712 A1* | 9/2014 | Foerster | B60L 53/16 348/143 |
| 2018/0201142 A1* | 7/2018 | Galin | H02J 7/0042 |
| 2018/0237161 A1* | 8/2018 | Minnick | B60L 53/14 |
| 2019/0217715 A1* | 7/2019 | Christen | B60L 53/31 |
| 2019/0275907 A1* | 9/2019 | Lee | B60L 53/35 |
| 2019/0315479 A1* | 10/2019 | Tillotson | G06T 7/73 |
| 2020/0148068 A1* | 5/2020 | Melatti | B60L 53/60 |
| 2020/0189413 A1* | 6/2020 | Fagan | B60L 53/37 |
| 2020/0361331 A1* | 11/2020 | Shin | H02J 7/0045 |

\* cited by examiner

METHOD TO DETECT THE PROPER CONNECTION OF A VEHICLE CHARGING CABLE

INTRODUCTION

Electric Vehicles can incorporate sensor systems installed around the charging outlet to notify the vehicle's operator when a charging station's cable has been plugged into the vehicle. They can thus help prevent the operator from driving off with the cable still attached and damaging the vehicle or the charging station, or both. However, when their hardware components wear down, these sensor systems can malfunction by not working when needed or by providing false positives. In addition, these systems cannot determine when a charging cable is plugged into the vehicle in an improper manner, which isn't likely providing the vehicle with adequate charge. It is therefore desirable to provide a system and method that can determine when a charging cable is attached to a vehicle while reducing the number of hardware components installed in the vehicle. It is also desirable for this system and method to be able to determine when the charging cable is insufficiently connected to the vehicle. Moreover, other desirable features and characteristics of the present invention will become apparent from the subsequent detailed description of the invention and the appended claims, taken in conjunction with the accompanying drawings and this background of the invention.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a method to detect a sufficient charging cable connection, the method including: capturing, via a processor, an image of at least a portion of a vehicle body; determining, via the processor, whether the image includes a charging cable being sufficiently engaged with the portion of the vehicle body; and based on the determination of whether the image includes the charging cable being sufficiently connected to the portion of the vehicle body, via the processor, producing a connection notification. Other embodiments of this aspect include corresponding computer systems, apparatus, and computer programs recorded on one or more computer storage devices, each configured to perform the actions of the methods.

Implementations may include one or more of the following features. The method where the connection notification is an audible alert generated by a horn system of a vehicle, a visual alert generated by one or more headlamps of the vehicle, a haptic alert generated by a piezoelectric device installed in the vehicle. The method where the connection notification is exhibited on a display located in an interior of a vehicle. The method where the connection notification is transmitted to a remote facility. The method where the portion of the vehicle includes a charge port door. The method where the processor implements an object recognition technique to determine whether the image includes the charging cable being sufficiently connected to the portion of the vehicle body. The method where the object recognition technique includes the steps of: identifying a Region of Interest (ROI) within the image; comparing the ROI to one or more reference images of sufficiently connected charging cables to arrive at a matching percentage value (MPV); and when the MPV is above a threshold value, determining that the image includes the charging cable being sufficiently connected to the portion of the vehicle body. Implementations of the described techniques may include hardware, a method or process, or computer software on a computer-accessible medium.

One general aspect includes a system to detect a sufficient charging cable connection, the system including a memory configured to include one or more executable instructions and a processor configured to execute the executable instructions, where the executable instructions enable the processor to carry out the steps of: capturing an image of at least a portion of a vehicle body; determining whether the image includes a charging cable being sufficiently engaged with the portion of the vehicle body; and based on the determination of whether the image includes the charging cable being sufficiently connected to the portion of the vehicle body, producing a connection notification. Other embodiments of this aspect include corresponding computer systems, apparatus, and computer programs recorded on one or more computer storage devices, each configured to perform the actions of the methods.

Implementations may include one or more of the following features. The system where the connection notification is an audible alert generated by a horn system of a vehicle, a visual alert generated by one or more headlamps of the vehicle, a haptic alert generated by a piezoelectric device installed in the vehicle. The system where the connection notification is exhibited on a display located in an interior of a vehicle. The system where the connection notification is transmitted to a remote facility. The system where the portion of the vehicle includes a charge port door. The system where the processor implements an object recognition technique to determine whether the image includes the charging cable being sufficiently connected to the portion of the vehicle body. The system where the object recognition technique includes the steps of: identifying a Region of Interest (ROI) within the image; comparing the ROI to one or more reference images of sufficiently connected charging cables to arrive at a matching percentage value (MPV); and when the MPV is above a threshold value, determining that the image includes the charging cable being sufficiently connected to the portion of the vehicle body. Implementations of the described techniques may include hardware, a method or process, or computer software on a computer-accessible medium.

One general aspect includes a non-transitory and machine-readable medium having stored thereon executable instructions adapted to detect a sufficient charging cable connection, which when provided to a processor and executed thereby, causes the processor to carry out the following steps: capturing an image of at least a portion of a vehicle body; determining whether the image includes a charging cable being sufficiently engaged with the portion of the vehicle body; and based on the determination of whether the image includes the charging cable being sufficiently connected to the portion of the vehicle body, producing a connection notification. Other embodiments of this aspect include corresponding computer systems, apparatus, and computer programs recorded on one or more computer storage devices, each configured to perform the actions of the methods.

Implementations may include one or more of the following features. The non-transitory and machine-readable memory where the connection notification is an audible alert generated by a horn system of a vehicle, a visual alert generated by one or more headlamps of the vehicle, a haptic alert generated by a piezoelectric device installed in the vehicle. The non-transitory and machine-readable memory where the connection notification is exhibited on a display located in an interior of a vehicle. The non-transitory and machine-readable memory where the connection notification is transmitted to a remote facility. The non-transitory and machine-readable memory where the processor implements an object recognition technique to determine whether the image includes the charging cable being sufficiently connected to the portion of the vehicle body. The non-transitory and machine-readable memory where the object recognition technique includes the steps of: identifying a Region of Interest (ROI) within the image; comparing the ROI to one or more reference images of sufficiently connected charging cables to arrive at a matching percentage value (MPV); and when the MPV is above a threshold value, determining that the image includes the charging cable being sufficiently connected to the portion of the vehicle body. Implementations of the described techniques may include hardware, a method or process, or computer software on a computer-accessible medium.

The above features and advantages and other features and advantages of the present teachings are readily apparent from the following detailed description for carrying out the teachings when taken in connection with the accompanying drawings.

BRIEF DESCRIPTION OF THE DRAWINGS

The disclosed examples will hereinafter be described in conjunction with the following drawing figures, wherein like numerals denote like elements, and wherein.

DETAILED DESCRIPTION

Figure 1:
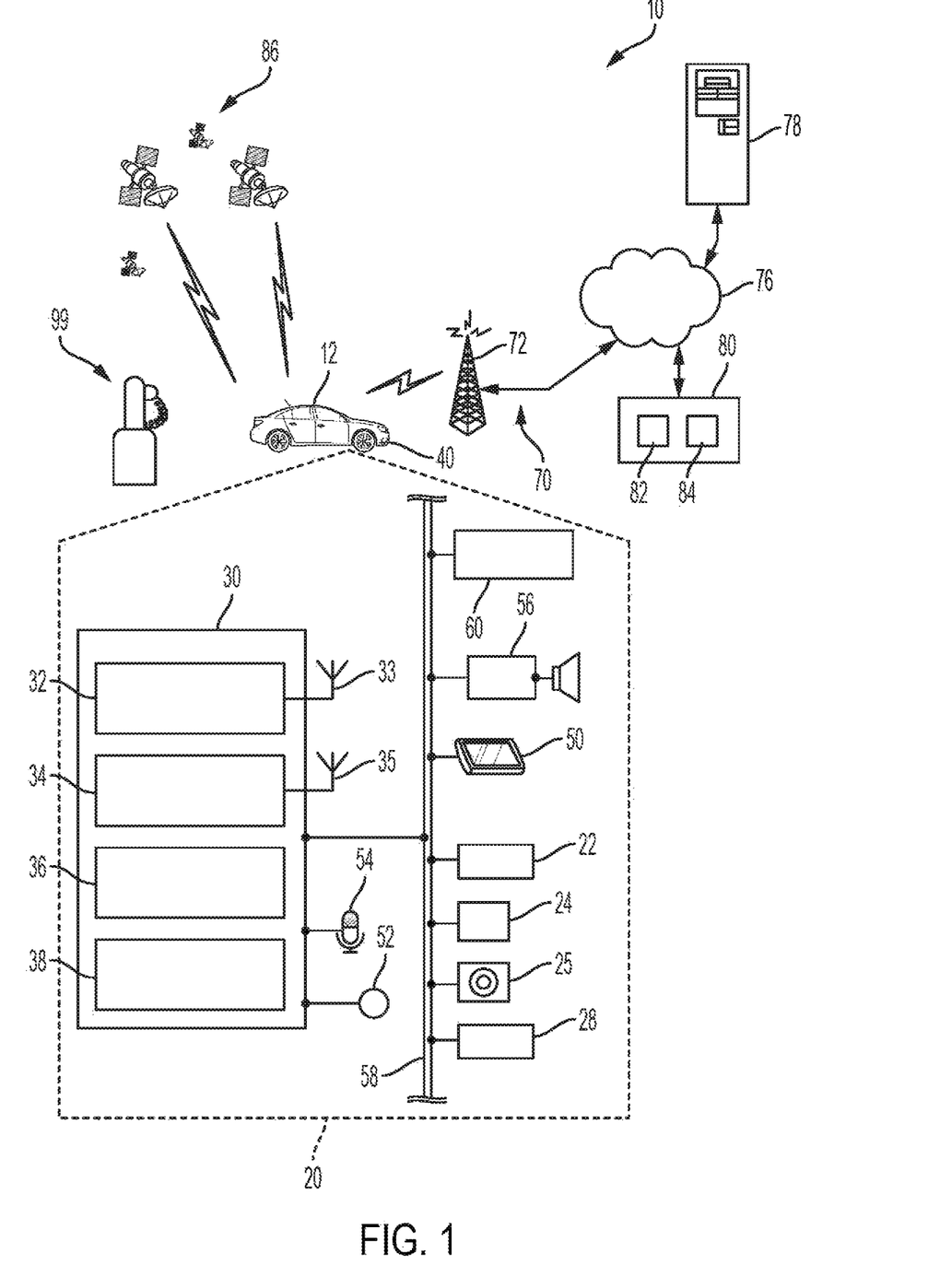
FIG. 1 is a block diagram depicting an exemplary embodiment of a system that is capable of utilizing the system and method disclosed herein.

With reference to FIG. 1, there is shown an operating environment that comprises a communications system 10 and that can be used to implement the method disclosed herein. Communications system 10 generally includes a vehicle 12 that includes vehicle electronics 20, one or more wireless carrier systems 70, a land communications network 76, a computer or server 78, a vehicle backend services facility 80, and a constellation of global navigation satellite system (GNSS) satellites 86. It should be understood that the disclosed method can be used with any number of different systems and is not specifically limited to the operating environment shown here. Thus, the following paragraphs simply provide a brief overview of one such communications system 10; however, other systems not shown here could employ the disclosed method as well.

Vehicle 12 is depicted in the illustrated embodiment as a passenger car, but it should be appreciated that any other vehicle including motorcycles, trucks, sports utility vehicles (SUVs), recreational vehicles (RVs), marine vessels, aircraft including unmanned aerial vehicles (UAVs), etc., can also be used. In one or more embodiments, vehicle 12 may be an electric vehicle (EV) that uses one or more electric motors for propulsion. Moreover, vehicle 12 may be powered through a battery that receives charge from a power source (e.g., charging station 99 or power outlet) via a charging cable with adapted plug.

Some of the vehicle electronics 20 are shown generally, in FIG. 1 and includes a global navigation satellite system (GNSS) receiver 22, a body control module or unit (BCM) 24, one or more cameras 25, other vehicle system modules (VSMs) 28, a telematics unit 30, vehicle-user interfaces 50-56, and onboard computer 60. Some or all of the different vehicle electronics may be connected for communication with each other via one or more communication busses, such as communications bus 58. The communications bus 58 provides the vehicle electronics with network connections using one or more network protocols and can use a serial data communication architecture. Examples of suitable network connections include a controller area network (CAN), a media oriented system transfer (MOST), a local interconnection network (LIN), a local area network (LAN), and other appropriate connections such as Ethernet or others that conform with known ISO, SAE, and IEEE standards and specifications, to name but a few. In other embodiments, a wireless communications network that uses short-range wireless communications (SRWC) to communicate with one or more VSMs of the vehicle can be used. In one embodiment, the vehicle 12 can use a combination of a hardwired communications bus 58 and SRWCs. The SRWCs can be carried out using the telematics unit 30, for example.

The vehicle 12 can include numerous vehicle system modules (VSMs) as part of vehicle electronics 20, such as the GNSS receiver 22, BCM 24, telematics unit 30 (vehicle communications system), vehicle-user interfaces 50-56, and onboard computer 60, as will be described in detail below. The vehicle 12 can also include other VSMs 28 in the form of electronic hardware components that are located throughout the vehicle and, which may receive input from one or more sensors and use the sensed input to perform diagnostic, monitoring, control, reporting, and/or other functions. Each of the VSMs 28 is hardwire connected by communications bus 58 to the other VSMs including the telematics unit 30. Moreover, each of the VSMs can include and/or be communicatively coupled to suitable hardware that enables intra-vehicle communications to be carried out over the communications bus 58; such hardware can include, for example, bus interface connectors and/or modems. One or more VSMs 28 may periodically or occasionally have their software or firmware updated and, in some embodiments, such vehicle updates may be over the air (OTA) updates that are received from computer 78 or remote facility 80 via land network 76 and telematics unit 30. As is appreciated by those skilled in the art, the above-mentioned VSMs are only examples of some of the modules that may be used in vehicle 12, as numerous others are also possible. It should also be appreciated that these VSMs can otherwise be known as electronic control units, or ECUs.

Global navigation satellite system (GNSS) receiver 22 receives radio signals from a constellation of GNSS satellites 86. The GNSS receiver 22 can be configured for use with various GNSS implementations, including global positioning system (GPS) for the United States, BeiDou Navigation Satellite System (BDS) for China, Global Navigation Satellite System (GLONASS) for Russia, Galileo for the European Union, and various other navigation satellite systems. For example, the GNSS receiver 22 may be a GPS receiver, which may receive GPS signals from a constellation of GPS satellites 86. And, in another example, GNSS receiver 22 can be a BDS receiver that receives a plurality of GNSS (or BDS) signals from a constellation of GNSS (or BDS) satellites 86. The GNSS received can determine a current vehicle location based on reception of a plurality of GNSS signals from the constellation of GNSS satellites 86. The vehicle location information can then be communicated to the telematics unit 30, or other VSM, such as the onboard computer 60. In one embodiment (as shown in FIG. 1), the wireless communications module 30 and/or a telematics unit can be integrated with the GNSS receiver 22 so that, for example, the GNSS receiver 22 and the telematics unit 30 (or the wireless communications device) are directly connected to one another as opposed to being connected via communications bus 58. In other embodiments, the GNSS receiver 22 is a separate, standalone module or there may be a GNSS receiver 22 integrated into the telematics unit 30 in addition to a separate, standalone GNSS receiver connected to telematics unit 30 via communications bus 58.

Body control module (BCM) 24 can be used to control various VSMs of the vehicle, as well as obtain information concerning the VSMs, including their present state or status, as well as sensor information. The BCM 24 is shown in the exemplary embodiment of FIG. 1 as being electrically coupled to the communication bus 58. In some embodiments, the BCM 24 may be integrated with or part of a center stack module (CSM) and/or integrated with telematics unit 30 or the onboard computer 60. Or, the BCM may be a separate device that is connected to other VSMs via bus 58. The BCM 24 can include a processor and/or memory, which can be similar to processor 36 and memory 38 of telematics unit 30, as discussed below. The BCM 24 may communicate with wireless device 30 and/or one or more vehicle system modules, such as an engine control module (ECM), audio system 56, or other VSMs 28; in some embodiments, the BCM 24 can communicate with these modules via the communications bus 58. Software stored in the memory and executable by the processor enables the BCM to direct one or more vehicle functions or operations including, for example, controlling central locking, air conditioning, power mirrors, controlling the vehicle primary mover (e.g., engine, primary propulsion system), and/or controlling various other vehicle modules. In one embodiment, the BCM 24 can be used (at least in part) to detect a vehicle event, such as a power on state or a power off state, based on one or more onboard vehicle sensor readings, as discussed more below.

One or more cameras 25 are operatively connected to the communications bus 58. The camera(s) 25 can be of the wide-angle or ultra-wide-angle variety and may be installed at various locations on the exterior of the vehicle 12 such as, for example, on the turn signal repeaters, at some location on the sideview mirror, and/or on the center pillar. The camera 25 can be angled such that a charging outlet and corresponding door is contained in the camera's 25 captured images. For example, one or more portions of the captured images may include the surfaces of the body panels that include the charging door and outlet.

Telematics unit 30 is capable of communicating data via shortrange wireless communications (SRWC) through use of SRWC circuit 32 and/or via cellular network communications through use of a cellular chipset 34, as depicted in the illustrated embodiment. The telematics unit 30 can provide an interface between various VSMs of the vehicle 12 and one or more devices external to the vehicle 12, such as one or more networks or systems at remote facility 80. This enables the vehicle to communicate data or information with remote systems, such as remote facility 80.

In at least one embodiment, the telematics unit 30 can also function as a central vehicle computer that can be used to carry out various vehicle tasks. In such embodiments, the telematics unit 30 can be integrated with the onboard computer 60 such that the onboard computer 60 and the device 30 are a single module. Or, the telematics unit 30 can be a separate central computer for the vehicle 12 in addition to the onboard computer 60. Also, the wireless communications device can be incorporated with or a part of other VSMs, such as a center stack module (CSM), body control module (BCM) 24, an infotainment module, a head unit, a telematics unit, and/or a gateway module. In some embodiments, the telematics unit 30 is a standalone module, and can be implemented as an OEM-installed (embedded) or aftermarket device that is installed in the vehicle.

In the illustrated embodiment, telematics unit 30 includes, the SRWC circuit 32, the cellular chipset 34, a processor 36, memory 38, SRWC antenna 33, and antenna 35. The telematics unit 30 can be configured to communicate wirelessly according to one or more short-range wireless communications (SRWC) such as any of the Wi-Fi™, WiMAX™, Wi-Fi™ Direct, other IEEE 802.11 protocols, ZigBee™, Bluetooth™, Bluetooth™ Low Energy (BLE), or near field communication (NFC). As used herein, Bluetooth™ refers to any of the Bluetooth™ technologies, such as Bluetooth Low Energy™ (BLE), Bluetooth™ 4.1, Bluetooth™ 4.2, Bluetooth™ 5.0, and other Bluetooth™ technologies that may be developed. As used herein, Wi-Fi™ or Wi-Fi™ technology refers to any of the Wi-Fi™ technologies, such as IEEE 802.11b/g/n/ac or any other IEEE 802.11 technology. And, in some embodiments, the telematics unit 30 can be configured to communicate using IEEE 802.11p such that the vehicle can carry out vehicle-to-vehicle (V2V) communications, or vehicle-to-infrastructure (V2I) communications with infrastructure systems or devices, such as the remote facility 80. And, in other embodiments, other protocols can be used for V2V or V2I communications. The short-range wireless communication (SRWC) circuitry 32 enables the telematics unit 30 to transmit and receive SRWC signals, such as BLE signals. The SRWC circuit can allow the device 30 to connect to another SRWC device. Additionally, in some embodiments, the telematics unit 30 contains a cellular chipset 34 thereby allowing the device to communicate via one or more cellular protocols, such as those used by cellular carrier system 70, through antenna 35. In such a case, the telematics unit 30 is user equipment (UE) that can be used to in carry out cellular communications via cellular carrier system 70.

Antenna 35 is used for communications during the normal operations of the telematics unit 30 and is generally known to be located throughout vehicle 12 at one or more locations external to the telematics unit 30. Telematics unit 30 may enable the vehicle 12 to be in communication with one or more local or remote networks (e.g., one or more networks at remote facility 80 or computers 78) via packet-switched data communication. This packet switched data communication may be carried out through use of a non-vehicle wireless access point or cellular system that is connected to a land network via a router or modem. When used for packet-switched data communication such as TCP/IP, the communications device 30 can be configured with a static Internet Protocol (IP) address or can be set up to automatically receive an assigned IP address from another device on the network such as a router or from a network address server.

Packet-switched data communications may also be carried out via use of a cellular network that may be accessible by the device 30. Communications device 30 may, via cellular chipset 34, communicate data over wireless carrier system 70. In such a scenario, radio transmissions may be used to establish a communications channel, such as a voice channel and/or a data channel, with wireless carrier system 70 so that voice and/or data transmissions can be sent and received over the channel. Data can be sent either via a data connection, such as via packet data transmission over a data channel, or via a voice channel using techniques known in the art. For combined services that involve both voice communication and data communication, the system can utilize a single call over a voice channel and switch as needed between voice and data transmission over the voice channel, and this can be done using techniques known to those skilled in the art.

Processor 36 can be any type of device capable of processing electronic instructions including microprocessors, microcontrollers, host processors, controllers, vehicle communication processors, and application specific integrated circuits (ASICs). It can be a dedicated processor used only for communications device 30 or can be shared with other vehicle systems. Processor 36 executes various types of digitally-stored instructions, such as software or firmware programs stored in memory 38, which enable the device 30 to provide a wide variety of services. For instance, in one embodiment, the processor 36 can execute programs or process data to carry out at least a part of the method discussed herein. Memory 38 may include any suitable non-transitory, computer-readable medium; these include different types of RAM (random-access memory, including various types of dynamic RAM (DRAM) and static RAM (SRAM)), ROM (read-only memory), solid-state drives (SSDs) (including other solid-state storage such as solid state hybrid drives (SSHDs)), hard disk drives (HDDs), magnetic or optical disc drives, that stores some or all of the software needed to carry out the various external device functions discussed herein. In one embodiment, the telematics unit 30 also includes a modem for communicating information over the communications bus 58.

Vehicle electronics 20 also includes a number of vehicle-user interfaces that provide vehicle occupants with a means of providing and/or receiving information, including visual display 50, pushbutton(s) 52, microphone 54, and audio system 56. As used herein, the term "vehicle-user interface" broadly includes any suitable form of electronic device, including both hardware and software components, which is located on the vehicle and enables a vehicle user to communicate with or through a component of the vehicle. The pushbutton(s) 52 allow manual user input into the communications device 30 to provide other data, response, and/or control input. Audio system 56 provides audio output to a vehicle occupant and can be a dedicated, stand-alone system or part of the primary vehicle audio system. According to one embodiment, audio system 56 is operatively coupled to both vehicle bus 58 and an entertainment bus (not shown) and can provide AM, FM and satellite radio, CD, DVD and other multimedia functionality. This functionality can be provided in conjunction with or independent of an infotainment module. Microphone 54 provides audio input to the telematics unit 30 to enable the driver or other occupant to provide voice commands and/or carry out hands-free calling via the wireless carrier system 70. For this purpose, it can be connected to an on-board automated voice processing unit utilizing human-machine interface (HMI) technology known in the art. Visual display or touch screen 50 is preferably a graphics display and can be used to provide a multitude of input and output functions. Display 50 can be a touch screen on the instrument panel, a heads-up display reflected off of the windshield, or other display. Various other vehicle-user interfaces can also be utilized, as the interfaces of FIG. 1 are only an example of one particular implementation.

Wireless carrier system 70 may be any suitable cellular telephone system. Carrier system 70 is shown as including a cellular tower 72; however, the carrier system 70 may include one or more of the following components (e.g., depending on the cellular technology): cellular towers, base transceiver stations, mobile switching centers, base station controllers, evolved nodes (e.g., eNodeBs), mobility management entities (MMEs), serving and PGN gateways, etc., as well as any other networking components that may be needed to connect wireless carrier system 70 with the land network 76 or to connect the wireless carrier system with user equipment (UEs, e.g., which can include telematics equipment in vehicle 12). Carrier system 70 can implement any suitable communications technology, including GSM/GPRS technology, CDMA or CDMA2000 technology, LTE technology, etc. In general, wireless carrier systems 70, their components, the arrangement of their components, the interaction between the components, etc. is generally known in the art.

Apart from using wireless carrier system 70, a different wireless carrier system in the form of satellite communication can be used to provide uni-directional or bi-directional communication with a vehicle. This can be done using one or more communication satellites (not shown) and an uplink transmitting station (not shown). Uni-directional communication can be, for example, satellite radio services, wherein programming content (news, music, etc.) is received by the uplink transmitting station, packaged for upload, and then sent to the satellite, which broadcasts the programming to subscribers. Bi-directional communication can be, for example, satellite telephony services using the one or more communication satellites to relay telephone communications between the 12 and the uplink transmitting station. If used, this satellite telephony can be utilized either in addition to or in lieu of wireless carrier system 70.

Land network 76 may be a conventional land-based telecommunications network that is connected to one or more landline telephones and connects wireless carrier system 70 to remote facility 80. For example, land network 76 may include a public switched telephone network (PSTN) such as that used to provide hardwired telephony, packet-switched data communications, and the Internet infrastructure. One or more segments of land network 76 could be implemented through the use of a standard wired network, a fiber or other optical network, a cable network, power lines, other wireless networks such as wireless local area networks (WLANs), networks providing broadband wireless access (BWA), or any combination thereof.

The computers 78 (only one shown) can be used for one or more purposes, such as for providing backend vehicle services to a plurality of vehicles (such as vehicle 12) and/or for providing other vehicle-related services. The computers 78 can be some of a number of computers accessible via a private or public network such as the Internet. Other such accessible computers 78 can be, for example: a service center computer where diagnostic information and other vehicle data can be uploaded from the vehicle; a client computer used by the vehicle owner or other subscriber for various purposes, such as accessing and/or receiving data communicated from the vehicle (e.g., data communicated using the lidar unit 40), as well as setting up and/or configuring subscriber preferences or controlling vehicle functions; or a vehicle telemetry data server that receives and stores data from a plurality of vehicles.

Vehicle backend services facility 80 is a remote facility, meaning that it is located at a physical location that is located remotely from the vehicle 12. The vehicle backend services facility 80 (or "remote facility 80" for short) may be designed to provide the vehicle electronics 20 with a number of different system back-end functions through use of one or more electronic servers 82. The vehicle backend services facility 80 includes vehicle backend services servers 82 and databases 84, which may be stored on a plurality of memory devices. Remote facility 80 may receive and transmit data via a modem connected to land network 76. Data transmissions may also be conducted by wireless systems, such as IEEE 802.11x, GPRS, and the like. Those skilled in the art will appreciate that, although only one remote facility 80 and one computer 78 are depicted in the illustrated embodiment, numerous remote facilities 80 and/or computers 78 may be used.

Servers 82 can be computers or other computing devices that include at least one processor and memory. The processors can be any type of device capable of processing electronic instructions including microprocessors, microcontrollers, host processors, controllers, vehicle communication processors, and application specific integrated circuits (ASICs). The processors can be dedicated processors used only for servers 82 or can be shared with other systems. The at least one processor can execute various types of digitally stored instructions, such as software or firmware, which enable the servers 82 to provide a wide variety of services. For network communications (e.g., intra-network communications, inter-network communications including Internet connections), the servers can include one or more network interface cards (NICs) (including, for example, wireless NICs (WNICs)) that can be used to transport data to and from the computers. These NICs can allow the one or more servers 82 to connect with one another, databases 84, or other networking devices, including routers, modems, and/or switches. In one particular embodiment, the NICs (including WNICs) of servers 82 may allow SRWC connections to be established and/or may include Ethernet (IEEE 802.3) ports to which Ethernet cables may be connected to that can provide for a data connection between two or more devices. Remote facility 80 can include a number of routers, modems, switches, or other network devices that can be used to provide networking capabilities, such as connecting with land network 76 and/or cellular carrier system 70.

Databases 84 can be stored on a plurality of memory, such as a powered temporary memory or any suitable non-transitory, computer-readable medium; these include different types of RAM (random-access memory, including various types of dynamic RAM (DRAM) and static RAM (SRAM)), ROM (read-only memory), solid-state drives (SSDs) (including other solid-state storage such as solid state hybrid drives (SSHDs)), hard disk drives (HDDs), magnetic or optical disc drives, that stores some or all of the software needed to carry out the various external device functions discussed herein. One or more databases at the remote facility 80 can store various information and can include a vehicle operation database that stores information regarding the operation of various vehicles (e.g., vehicle telemetry or sensor data). Also, the remote server 80 can receive can thus act to distribute software (and/or software updates) to the various vehicles including vehicle 12.

Electric vehicle charging station 99 is designed to provide electric charge to vehicle 12 so as to rejuvenate the vehicle's battery (not shown). Charging station 99 may be installed on a concrete pedestal and can rely on 1 or 2 phase AC power as well as varieties of DC power. Charging station 99 may include a charging cable that has a plug specifically adapted to connect with a charging outlet embedded at some location on the body of vehicle 12. Skilled artists will see that charging stations are well known in the art.

Method

Figure 2:
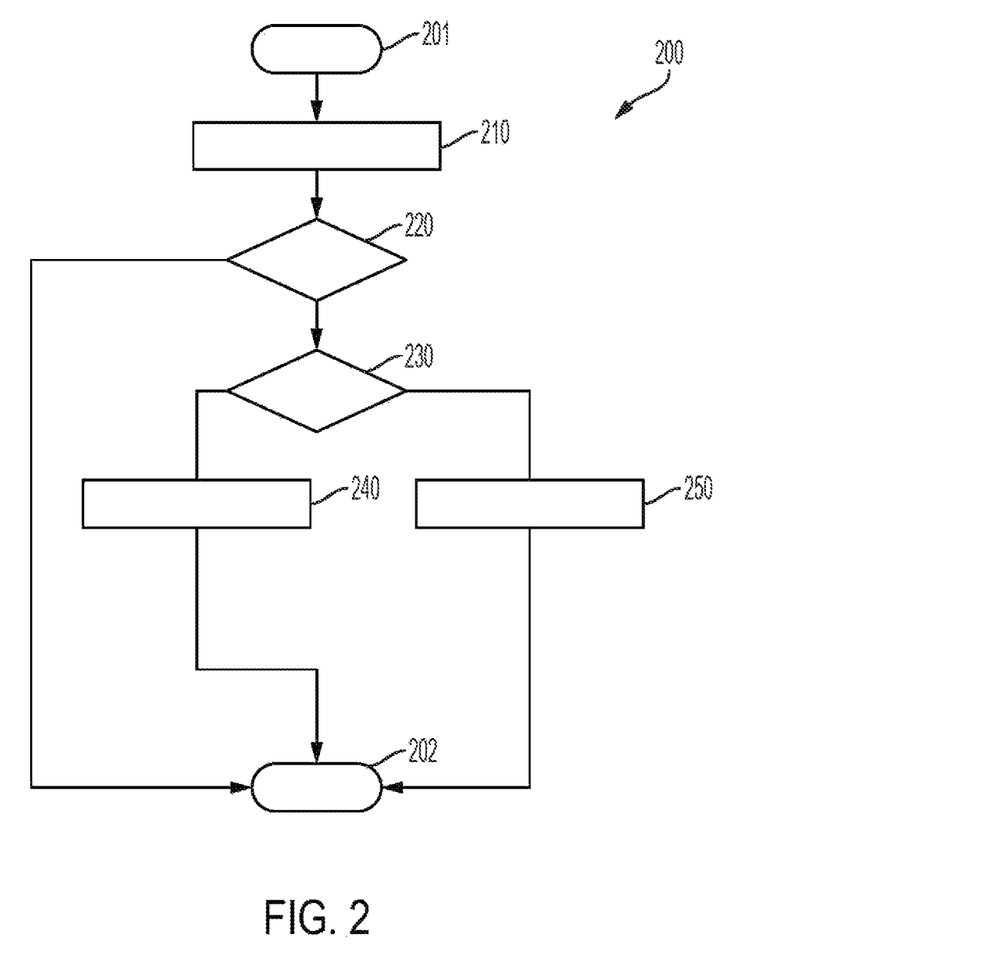
FIG. 2 is a flowchart of an exemplary process to detect a sufficient charging cable connection in accordance with one or more exemplary embodiments.

Now turning to FIG. 2, there is shown an embodiment of a method 200 to detect when and electric vehicle (EV) charging cable is connected to vehicle 12 and when that cable is improperly connected to the vehicle's battery outlet as well as notify the vehicle's operator of the connection status. One or more aspects of charging cable connection detection and notification method 200 may be completed through vehicle telematics unit 30 which may include one or more executable instructions incorporated into memory device 38 and carried out by processor 36 (controller). One or more ancillary aspects of method 200 may otherwise, for example, be completed through remote facility 80 which may include one or more executable instructions incorporated into databases 84 and carried out by server 82.

Method 200 is supported by telematics unit 30 being configured to establish one or more communication protocols with remote facility 80. This configuration may be established by a vehicle manufacturer at or around the time of the telematics unit's assembly or after-market (e.g., via vehicle download using the afore-described communication system 10 or at a time of vehicle service, just to name a couple of examples). In at least one implementation, one or more instructions are provided to the telematics unit 30 and stored on non-transitory computer-readable medium (e.g., memory device 38).

Method 200 begins at 201 when the telematics unit 30 wakes up from being in a standby mode (sleep). In various embodiments, this may occur after an operator of the vehicle communicates with BCM 24 (either directly or indirectly via a Passive Entry Passive Start module) by using their key fob to unlock one or more vehicle doors or remotely starting the vehicle 12. Method 200 may also begin 201 shortly after a hardware sensor (e.g., a push button sensor) installed in the vehicle's charging port signals that a charging plug has been pushed into the outlet of the vehicle 12 (e.g., less than one (1) second after the signal is transmitted). It should be understood, however, that method 200 could also begin 201 in other instances such as when the engine is turned to an ON state or turned to the OFF state or when the vehicle's transmission is transitioned into the drive gear or has been placed in the park gear for some amount of time.

Figure 3:
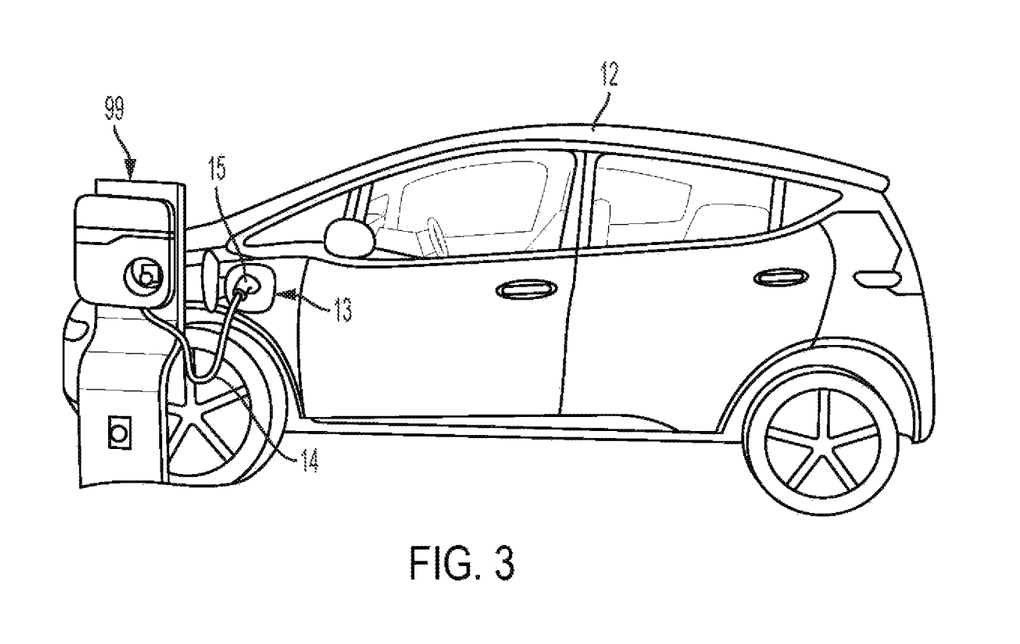
FIG. 3 depicts an application of an exemplary aspect of the process of FIG. 2 in accordance with one or more exemplary embodiments.

In step 210, one or the vehicle's external cameras 25 will capture an image of at least a portion of an exterior body panel of vehicle 12 that includes a view of the charging port 13 (i.e., showing the entire charging outlet) and corresponding port door. Depending on where the charger outlet has been installed on vehicle 12, the panel may be the front wing panel located next to the driver side door (see FIG. 3) or the panel may be a rear quarter panel of the vehicle's body.

Moreover, in this step, the captured image will be transmitted to the vehicle's telematics unit 30 for processing.

In step 220, telematics unit 30 (i.e., processor 36) will determine whether a charging cable 14 and plug 15 (of charging station 99, for example) is present within the captured image. Telematics unit 30 may implement an object recognition technique to make this determination. An exemplary object recognition technique that may be used in this step is discussed below. If a charging cable 14 is present in the image, method 200 will move to step 230; otherwise, the method 200 will move to completion 202.

In step 230, telematics unit 30 will determine whether the charging cable is sufficiently plugged into the outlet of the vehicle charging port such that it appears power from charging station 99 is properly being provided to the vehicle 12. For example, if the image reflects that the plug of the charging cable is not fully pushed into the outlet of the vehicle's charging port 13, so as to make an adequate electrical connection between the charging station 99 and vehicle 12, then telematics unit 30 will determine that the charging cable is not sufficiently plugged into the vehicle's outlet. In an additional example, if the image reflects some portion of the plug being partially separated or otherwise offset from the outlet, then telematics unit 30 will determine that the charging cable is not sufficiently plugged into the vehicle's outlet. Telematics unit 30 may also implement the object recognition technique used in step 220 to make this determination, as discussed below. Moreover, if the charging cable is sufficiently plugged into the outlet, method 200 will move to step 240; otherwise, the method 200 will move to step 250.

In step 240, telematics unit 30 will produce a connection notification configured to let the vehicle operator know that there is a charging cable sufficiently connected to the vehicle 12, and thus should be providing charge to the vehicle's battery. Step 240 may occur when the vehicle is turned to the ON state (as follows, the image is captured after telematics unit 30 wakes up from being in a standby mode) and before the vehicle's transmission is placed in the drive gear. This will allow the vehicle's operator to know there is a charging cable connected to the vehicle 12 and not to drive away with the cable still attached.

In various embodiments, this connection notification can be an audible alert generated by a horn system of a vehicle 12. This audible alert may, for example, be three consecutive short honks from the horn system, which are loud enough to get the vehicle operator's attention and allow the operator to realize the charging cable is connected and properly charging the vehicle 12. In various embodiments, this collision warning notification can be a visual alert generated by one or more headlamps of a vehicle (e.g., generating the visual alert in either the right-hand or left-hand headlamp or generating the visual alert in both headlamps at the same time). This visual alert may, for example, be three consecutive short light blinks (high or low beam) by either/both headlamps designed to get the vehicle operator's attention and allow the operator to realize the charging cable is connected and properly charging the vehicle 12. In various embodiments, this connection notification can be a haptic alert generated by a piezoelectric device embedded in the vehicle operator's seat or in the vehicle's steering wheel. This haptic alert may, for example, be vibrations in the seat/steering wheel designed to get the vehicle operator's attention and allow the operator to realize the charging cable is connected and properly charging the vehicle 12.

In various embodiments, the connection notification can be presented to the display 50 to be exhibited to the vehicle operator or some other passenger in the vehicle's interior cabin. The connection notification can display information to get the vehicle operator's attention and let them realize the charging cable is connected and properly charging the vehicle 12. The connection notification may be presented as a graphic having text language stating "A CHARGING CABLE IS PROPERLY CONNECTED TO YOUR VEHICLE" or the like. While the connection notification is being exhibited on display 50, it may be accompanied by an audio alert through audio system 56 (e.g., a chime from a chime module installed in audio system). After step 240, method 200 will move to completion 202.

In step 250, telematics unit 30 will produce a connection notification configured to let the vehicle operator know that a charging cable has been improperly connected to the vehicle 12, and thus is not likely providing an adequate charge to the vehicle's battery. Step 250 can be particularly useful in those instances that method 200 begins after a signal is transmitted to indicate a charging plug has been pushed into the outlet of the vehicle 12. However, step 250 can be useful when method 200 begins after some other vehicle/telematics unit 30 event (e.g., the doors being locked/unlocked by a keyfob).

In various embodiments, as discussed above, this connection notification can be an audible alert generated by a horn system of a vehicle 12. This audible alert may, for example, be three consecutive short honks from the horn system, which are loud enough to get the vehicle operator's attention and allow the operator to realize the charging cable is improperly connected to the vehicle 12. In various embodiments, as discussed above, this collision warning notification can be a visual alert generated by one or more headlamps of a vehicle, designed to get the vehicle operator's attention and allow the operator to realize the charging cable is improperly connected to the vehicle 12 (e.g., consecutively turning the headlamps on and off). In various embodiments, as discussed above, this connection notification can be a haptic alert generated by one or more piezoelectric devices embedded in the vehicle operator's seat or in the vehicle's steering wheel, designed to get the vehicle operator's attention and allow them to realize the charging cable is improperly connected to the vehicle 12.

In various embodiments, the connection notification can be presented to the display 50 to be exhibited in the vehicle's interior cabin. The connection notification can display information to get the vehicle operator's attention and let them realize the charging cable is not properly connected to the vehicle's outlet and thus not likely providing adequate charge to the vehicle's battery. The connection notification may be presented as a graphic having text language stating "A CHARGING CABLE HAS BEEN DETECTED AND DOES NOT APPEAR TO BE PROPERLY CONNECTED TO YOUR VEHICLE. YOUR VEHICLE MAY NOT BE ADEQUATELY CHARGING" or the like.

In various embodiments, especially in those instances in which vehicle 12 is part of a fleet, the connection notification can be transmitted to the backend services facility 80 via the wireless carrier system 70. Moreover, the notification can be displayed on a computer screen or some other display or alerting device located at this remote facility 80 to let a fleet manager of vehicle 12 know to go to the location of the vehicle 12 and reconnect the plug of the charging cable to the vehicle's outlet. The notification may also inform the fleet manager that they should visually/physically verify they have properly reconnected the plug to the outlet before they return from the vehicle's location. After step 250, method 200 will move to completion 202.

Figure 4:
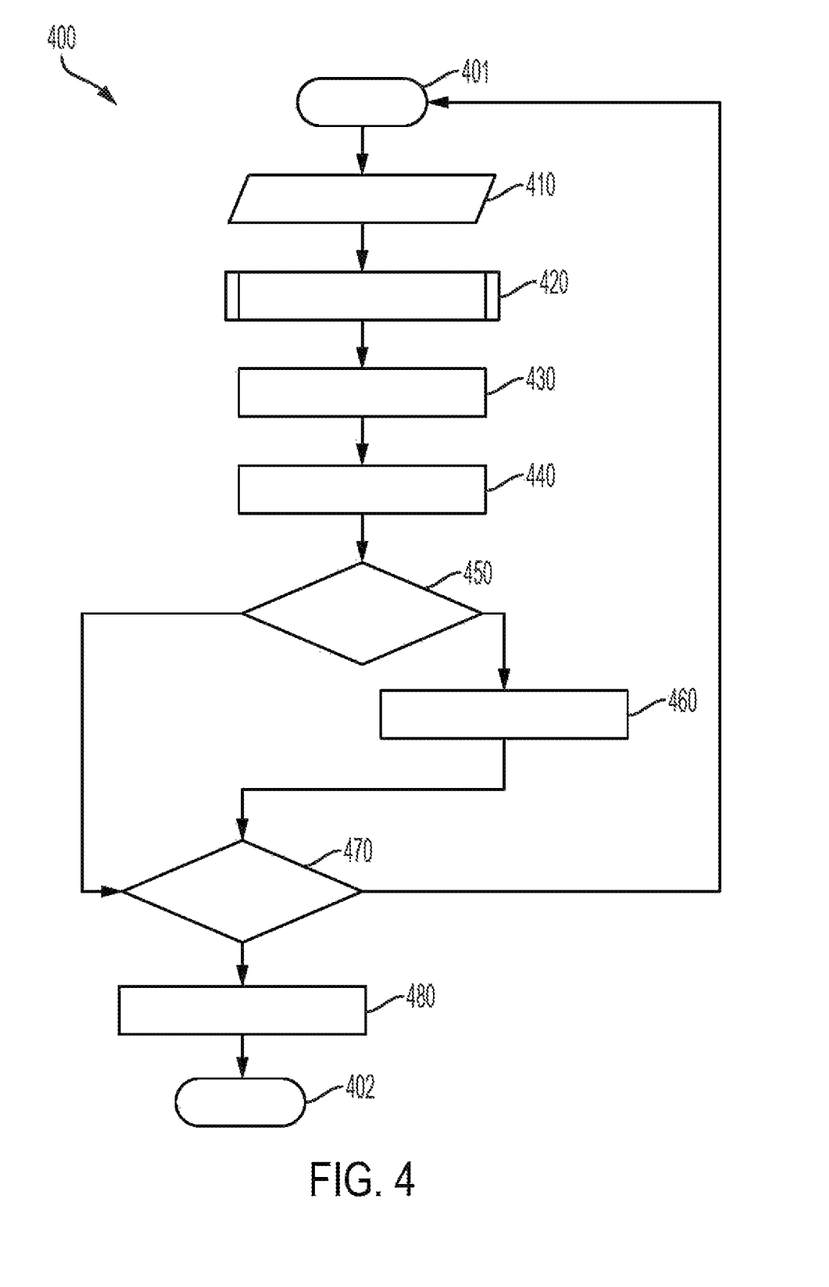
FIG. 4 is a flowchart of an exemplary object recognition technique to carry out the exemplary process of FIG. 2.

Turning to FIG. 4, there is shown an embodiment of an object recognition technique that can be implemented by telematics unit 30 to assist in making one or more decisions of method 200 (e.g., such as the determinations made in steps 220 and 230, discussed above). The object recognition technique can be stored to the memory 38 and carried out by processor 36 of telematics unit 30. In step 410, with additional references to FIG. 5, the captured image 405 will be retrieved from the processor 36 or memory 38. In step 420, a region of interest (ROI) 406 will be identified in the image 405 and cropped from the rest of the image's contents. In step 430, the ROI 406 image will be binarized (not shown). In step 440, gaps will be filled in the ROI 406 and noise will be removed from the ROI 406. In step 450, the pixel coverage ratio is determined. If the coverage ratio is less than 60%, then technique 400 will move to step 460; otherwise, technique 400 will move to step 470. In step 460, the contrast of the ROI 406 will be enhanced such that the coverage ratio goes above 60%.

Figure 5:
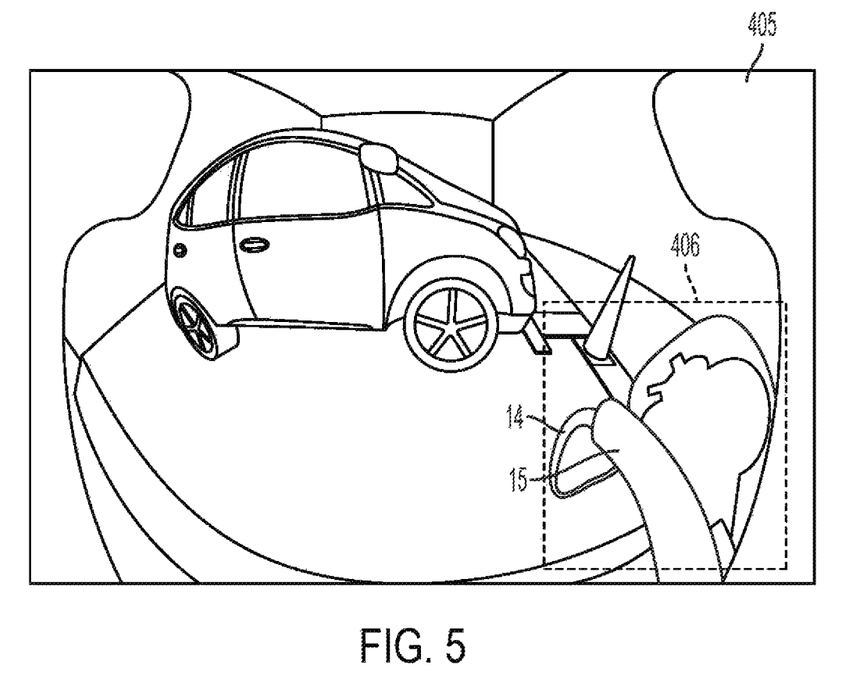
FIG. 5 depicts an application of an exemplary aspect of the technique of FIG. 4 in accordance with one or more exemplary embodiments.

In step 470, ROI 406 of sufficient pixel coverage ratio will be compared to one or more reference images. Each of these reference images disclose a charging cable 14 being sufficiently connected to the outlet on the body of a vehicle (i.e., the cable's plug 15 is adequately inserted into the outlet on the vehicle 12). The images may moreover be stored in and retrieved from a database found in memory 38.

In this step, a matching percentage value (MPV) of the ROI 406 and the one or more reference images will be calculated. The MPV can be understood as the amount of overlap between the ROI 406 and reference image(s). For instance, if there is no charging cable plug in the outlet, the MPV could be somewhere between 0%-25%. However, if the ROI discloses a properly connected charging cable, then the MPV could be somewhere above 75%. Moreover, if the ROI discloses that the charging cable plug is not properly connected to the vehicle's outlet, then the MPV would likely be somewhere between 25% and 75%. Furthermore, if the MPV is calculated to be above 25% then technique 400 will move to step 480. However, if the MPV is calculated to be below 25%, then technique will move back to the beginning 401 to start the process over with another captured image (if possible).

In step 480, an output of technique 400 will be generated. For example, if the MPV is above 75% the output will indicate that the charger plug is sufficiently connected to the vehicle's outlet. Moreover, for example, if the MPV is between 25% and 75% the output will indicate that a charging cable is present but its plug is improperly connected to the vehicle 12. As should be understood, the output can be used to allow telematics unit 30 to make one or more decisions such as those made in steps 220 and 230, discussed above. After step 480, technique 400 will move to completion 402.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the system and/or method that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

None of the elements recited in the claims are intended to be a means-plus-function element within the meaning of 35 U.S.C. § 112(f) unless an element is expressly recited using the phrase "means for," or in the case of a method claim using the phrases "operation for" or "step for" in the claim.

What is claimed is:

1. A method to detect a sufficient charging cable connection, the method comprising:
   capturing, via a camera, an image of at least a portion of a vehicle body wherein the camera is mounted to the vehicle body;
   determining, via a processor, whether the image includes a charging cable being sufficiently engaged with the portion of the vehicle body, wherein the processor implements an object recognition technique to determine whether the image includes the charging cable being sufficiently connected to the portion of the vehicle body, wherein the object recognition technique includes identifying a region of interest within the image, comparing the region of interest to one or more reference images of sufficiently connected charging cables to arrive at a matching percentage value, and determining that the image includes the charging cable being sufficiently connected to the portion of the vehicle body in response to the matching percentage value exceeding a threshold value; and based on the determination of whether the image includes the charging cable being sufficiently connected to the portion of the vehicle body, via the processor, producing a connection notification.

2. The method of claim 1, wherein the connection notification is an audible alert generated by a horn system of a vehicle, a visual alert generated by one or more headlamps of the vehicle, a haptic alert generated by a piezoelectric device installed in the vehicle.

3. The method of claim 1, wherein the connection notification is exhibited on a display located in an interior of a vehicle.

4. The method of claim 1, wherein the connection notification is transmitted to a remote facility.

5. The method of claim 1, wherein the portion of the vehicle includes a charge port door.

6. A system to detect a sufficient charging cable connection, the system comprising:

a memory configured to comprise one or more executable instructions and a processor configured to execute the executable instructions, wherein the executable instructions enable the processor to carry out the steps of:

capturing an image of at least a portion of a vehicle body, by a camera mounted to the vehicle body;

determining, using an object recognition technique, whether the image includes a charging cable being sufficiently engaged with the portion of the vehicle body, wherein the object recognition technique includes identifying a region of interest within the image, comparing the region of interest to one or more reference images of sufficiently connected charging cables to arrive at a matching percentage value, and determining that the image includes the charging cable being sufficiently connected to the portion of the vehicle body in response to the matching percentage value exceeding a threshold value; and based on the determination of whether the image includes the charging cable being sufficiently connected to the portion of the vehicle body, producing a connection notification.

7. The system of claim 6, wherein the connection notification is an audible alert generated by a horn system of a vehicle, a visual alert generated by one or more headlamps of the vehicle, a haptic alert generated by a piezoelectric device installed in the vehicle.

8. The system of claim 6, wherein the connection notification is exhibited on a display located in an interior of a vehicle.

9. The system of claim 6, wherein the connection notification is transmitted to a remote facility.

10. The system of claim 6, wherein the portion of the vehicle includes a charge port door.

11. A non-transitory and machine-readable medium having stored thereon executable instructions adapted to detect a sufficient charging cable connection, which when provided to a processor and executed thereby, causes the processor to carry out the following steps:

capturing an image of at least a portion of a vehicle body, by a camera mounted to the vehicle body;

determining, using an object recognition technique, whether the image includes a charging cable being sufficiently engaged with the portion of the vehicle body, wherein the object recognition technique includes identifying a region of interest within the image, comparing the region of interest to one or more reference images of sufficiently connected charging cables to arrive at a matching percentage value, and determining that the image includes the charging cable being sufficiently connected to the portion of the vehicle body in response to the matching percentage value exceeding a threshold value; and based on the determination of whether the image includes the charging cable being sufficiently connected to the portion of the vehicle body, producing a connection notification.

12. The non-transitory and machine-readable memory of claim 11, wherein the connection notification is an audible alert generated by a horn system of a vehicle, a visual alert generated by one or more headlamps of the vehicle, a haptic alert generated by a piezoelectric device installed in the vehicle.

13. The non-transitory and machine-readable memory of claim 11, wherein the connection notification is exhibited on a display located in an interior of a vehicle.

14. The non-transitory and machine-readable memory of claim 11, wherein the connection notification is transmitted to a remote facility.

* * * * *